United States Patent [19]
Kim et al.

[11] Patent Number: 5,908,735
[45] Date of Patent: Jun. 1, 1999

[54] METHOD OF REMOVING POLYMER OF SEMICONDUCTOR DEVICE

[75] Inventors: Sang Wook Kim; Hae Jung Lee; Il Seok Seo, all of Kyoungkido, Rep. of Korea

[73] Assignee: Hyundai Electronics Industries Co., Ltd., Kyoungkido, Rep. of Korea

[21] Appl. No.: 08/752,882

[22] Filed: Nov. 20, 1996

[30] Foreign Application Priority Data

Dec. 16, 1995 [KR] Rep. of Korea ............ 95-50996

[51] Int. Cl.⁶ .................................................. G03F 7/00
[52] U.S. Cl. ...................... 430/329; 430/313; 430/330
[58] Field of Search ........................... 430/311, 313, 430/329, 330; 216/63, 72; 438/706, 734

[56] References Cited

U.S. PATENT DOCUMENTS 5,702,869  12/1997  Chien ........................... 430/329

Primary Examiner—Kathleen Duda
Attorney, Agent, or Firm—Jacobson, Price, Holman & Stern, PLLC

[57] ABSTRACT

A method of removing a polymer of a semiconductor device is disclosed including the steps of: forming a photoresist pattern on a to-be-etched layer; etching the to-be-etched layer using a mixed gas containing carbon/fluorine compound and oxygen gas with the use of the photoresist pattern; and removing the photoresist pattern at a temperature of below 200 C., and at the same time, dry-etching a polymer, the polymer being generated during the etching of the to-be-etched layer, the photoresist pattern being removed in a dry etching chamber.

18 Claims, 3 Drawing Sheets

METHOD OF REMOVING POLYMER OF SEMICONDUCTOR DEVICE

BACKGROUND OF THE INVENTION

The present invention relates to a method of removing a polymer of a semiconductor device and, more particularly, to a method of removing a polymer which is generated during a dry etching of an oxide layer using a $CxFy+O_2$ plasma for the purpose of forming a contact hole of a semiconductor device.

A conventional method of removing a polymer of a semiconductor device will be explained below with reference to FIGS. 1A to 1D. Referring to FIG. 1A, an oxide layer 2 is formed on a silicon substrate 1, and a photoresist pattern is formed thereon. Referring to FIG. 1B, when oxide layer 2 is dry-etched using a $CxFy+O_2$ plasma with the use of photoresist pattern 3 as an etch mask, CxFyOz polymer 4 is left after the dry etching. Here, CxFyOz polymer 4 is not left on a portion where oxide layer 2 is exposed because silicon is generated at the portion during the dry etching and thus CxFyOz polymer 4 is volatilized as SixFy and CxOy. However, CxFyOz polymer 4 is left on a portion where only the photoresist pattern is left because silicon is not generated at this portion.

Referring to FIG. 1C, photoresist pattern 3 is removed through a dry etching. Here, it is not possible to remove CxFyOz polymer 4 through an oxidation of it because photoresist pattern 3 is etched at a higher temperature of above 200 C. Accordingly, as shown in FIG. 1D, the polymer is completely removed using a diluted solution containing HF.

As described above, in the conventional method of removing the polymer, the CxFyOz polymer generated during the dry etching of the oxide layer is not completely removed when the photoresist pattern is removed. Accordingly, an additional treatment using the diluted HF solution is required in order to remove the CxFyOz polymer. This increases the time required for fabrication of the semiconductor device and decreases the characteristic of the device and its production yield.

SUMMARY OF THE INVENTION

It is object of the present invention to provide a method of removing a polymer of a semiconductor device, which completely removes the polymer generated during a dry etching of an oxide layer, a nitride layer or a metal layer using a $CxFy+O_2$ plasma without employing a separate process for removing the polymer.

To accomplish the object of the present invention, there is provided a method of removing a polymer of a semiconductor device, including the steps of: forming a photoresist pattern on a to-be-etched layer; etching the to-be-etched layer using a mixed gas containing carbon/fluorine compound and oxygen gas with the use of the photoresist pattern; and removing the photoresist pattern at a temperature of below 200 C., and at the same time, dry-etching a polymer, the polymer being generated during the etching of the to-be-etched layer, the photoresist pattern being removed in a dry etching chamber.

For the object of the present invention, there is further provided a method of removing a polymer of a semiconductor device, including the steps of: forming a photoresist pattern on a to-be-etched layer; etching the to-be-etched layer using the photoresist pattern; removing the photoresist pattern at a lower temperature of below 200 C., and at the same time, dry-etching a polymer, the polymer being generated during the etching of the to-be-etched layer, the photoresist pattern being removed in a dry etching chamber; and removing the photoresist pattern at a higher temperature of above 200 C., the photoresist pattern being removed in the dry etching chamber.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein:

FIGS. 1A to 1D are cross-sectional views showing a conventional method of removing a polymer of a semiconductor device; and FIGS. 2A and 2B are cross-sectional views showing a method of removing a polymer of a semiconductor device according to the present invention.

DETAILED DESCRIPTION OF PREFERRED EMBODIMENT

Figure 1A:
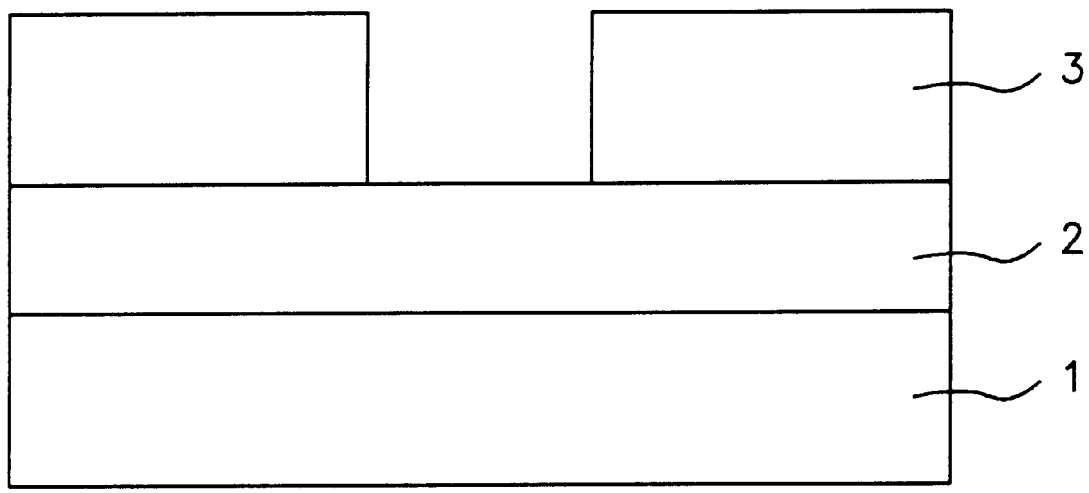
Figure 1B:
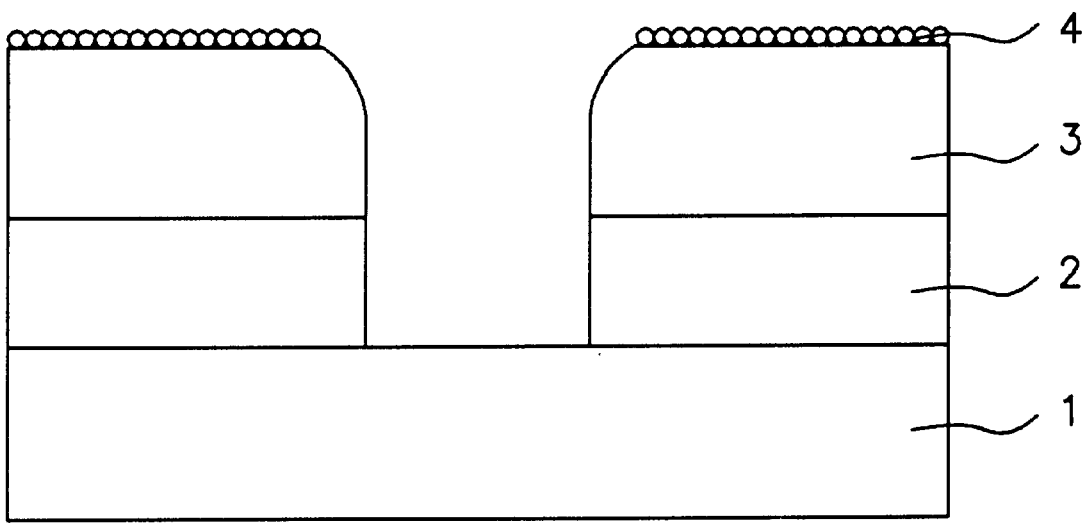
Figure 1C:
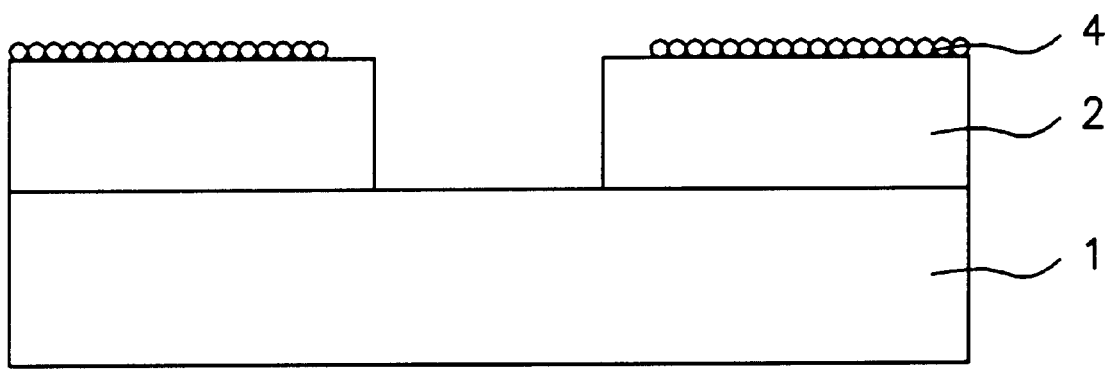
Figure 1D:
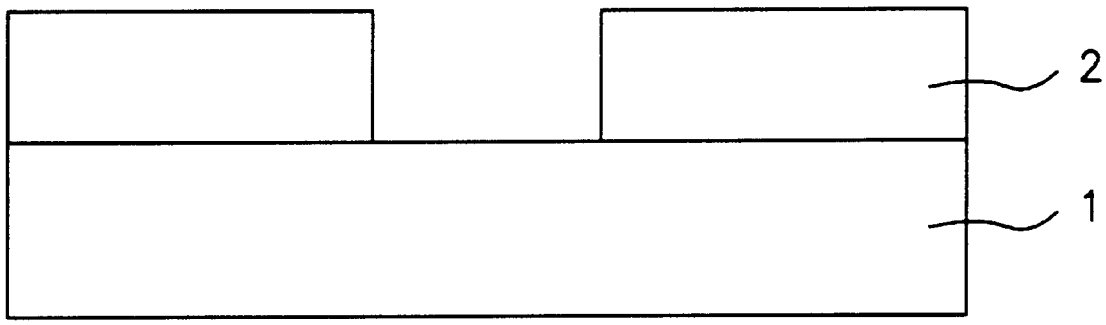
Figure 2A:
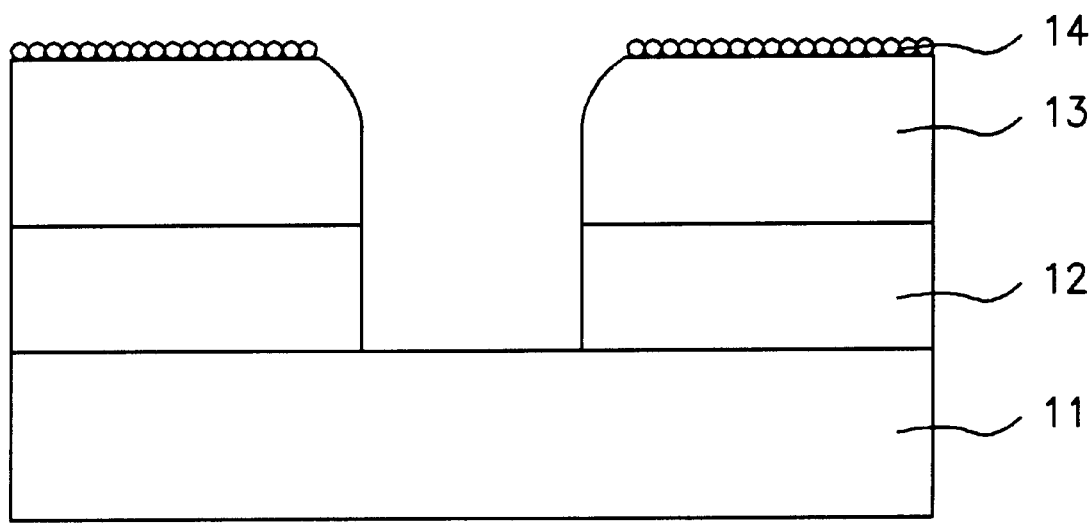
Figure 2B:
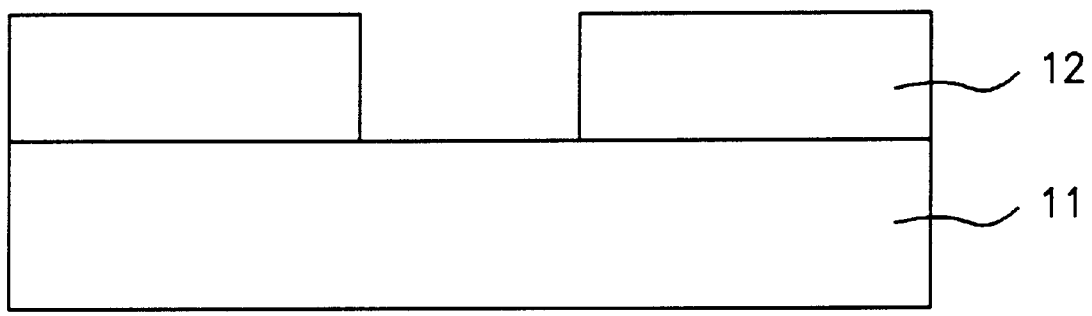

A preferred embodiment of the present invention will be explained below with reference to the accompanying drawings. FIGS. 2A and 2B are cross-sectional views showing a method of removing a polymer of a semiconductor device according to the present invention. The present invention removes the CxFyOz polymer using the fact that the reaction of $CxFyOz+O_2 \rightarrow CxOy+F+O_2$ is easily carried out according to its physical energy if its process temperature is lower. Accordingly, the present invention does not require the additional treatment using the diluted HF solution used in the aforementioned conventional method.

Referring to FIG. 2A, an oxide layer 12 is formed on a silicon substrate 11, and a photoresist pattern 13 is formed thereon. Then, oxide layer 12 is dry-etched using a $CxFy+O_2$ plasma including a gas containing carbon, fluorine and oxygen such as $CF_4$, $C_2F_6$, $C_3F_8$, $C_4F_8$, $CHF_3$ and $CH_3F$, and oxygen. Here, CxFyOz polymer 14 is formed on photoresist pattern 13 because oxide layer 12 is dry-etched using the $CxFy+O_2$ plasma.

Referring to FIG. 2B, the temperature of a reaction chamber used for the dry etching is lowered and the photoresist pattern is dry-etched, to thereby remove photoresist pattern 13 and $CxFy+O_2$ polymer 14. This will be explained below in more detail.

If the temperature of the reaction chamber is higher when photoresist pattern 13 is etched, an oxidation in accordance with the $O_2$ plasma is dominant. Accordingly, the photoresist of an organic material is easily removed but the CxFyOz polymer of an inorganic material is difficult to remove. However, if the temperature of the reaction chamber is lowered, the etch rate of the photoresist is decreased but the oxidation of the CxFyOz polymer is restrained. Thus, the reaction of $CxFyOz+O_2 \rightarrow CxOy+F+O_2$ is dominant due to its physical energy. By doing so, the polymer can be removed.

When the polymer is removed, it is preferable that the temperature of the reaction chamber is below 200 C. Furthermore, the photoresist pattern and polymer may be removed using one of $O_2$ plasma, $O_2+N_2$ plasma, $O_2+N_2+CF_4$ plasma and $O_2+CF_4$ plasma. According to a preferable embodiment of the present invention, the process of removing the photoresist pattern is carried out under the process condition of the reaction chamber, that is, microwave power of 500 to 1500 W, RF power of 0 to 1000 W, pressure of 0.5 to 10 mTorr, flow rate of $C_4F_8$ of 5 to 50 sccm and flow rate of $O_2$ of below 50 sccm. Furthermore, a mixed solution of sulfuric acid and oxygenated water may be used in order to remove an organic substance like photoresist remnant which may be left on the silicon substrate exposed when the oxide layer is etched.

For the purpose of removing the polymer completely, a process of removing the polymer using the diluted solution containing HF may be added before or after the process of removing the photoresist pattern. Moreover, in order to improve the etch rate of the photoresist, its etching process may be divided into two steps. That is, the first step is carried out at a lower temperature of below 200 C. for a predetermined time, and then the second step is carried out at a higher temperature of above 200 C. for a predetermined time. By doing so, the polymer is prevented from being generated, and at the same time, the etch rate of the etching process can be improved.

According to the present invention, the CxFyOz polymer generated during the etching of the oxide layer using CxFy+$O_2$ plasma can be completely removed when the photoresist is removed without employing the additional HF treatment. This reduces the time required for developing a semiconductor device and increases the characteristic of the device and its production yield.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method of removing a polymer of a semicoiductor device, said method comprising the steps of:
    forming a photoresist pattern on a layer which includes a to-be-etched portion;
    etching said to-be-etched portion using a mixed gas containing carbon/fluorine compound and oxygen gas, wherein said photoresist pattern is used as an etching mask; and
    removing said photoresist pattern and a polymer that is generated during the etching step by dry etching at a temperature range between 100° C. and 200° C. in a dry etching chamber.

2. The method as claimed in claim 1, further comprising a step of treating said layer using a mixed solution of sulfuric acid and oxygenated water in order to remove an organic substance that is left on the wafer exposed by said etching step.

3. The method as claimed in claim 1, wherein said layer is selected from the group consisting of an oxide layer, a nitride layer and a metal layer.

4. The method as claimed in claim 3, wherein said layer is dry-etched by introducing a gas containing carbon and fluorine into a reaction chamber, and then generating a plasma in said chamber.

5. The method as claimed in claim 1, wherein said carbon/fluorine compound gas is selected from the group consisting of $CF_4$, $C_2F_6$, $C_3F_8$, $C_4F_8$, $CHF_3$ and $CH_3F$.

6. The method as claimed in claim 1, wherein the step of removing is carried out under a process condition of said chamber, said process condition being power of 500 to 1500 W, RF power of 0 to 1000 W, pressure of 0.5 to 10 mTorr, flow rate of $C_4F_8$ of 5 to 50 sccm and flow rate of $_2O$ of below 50 sccm.

7. The method as claimed in claim 1, wherein said photoresist pattern and the polymer are removed using at least one of the group consisting of $O_2$ plasma, $O_2+N_2$ plasma, $O_2+N_2+CF_4$ plasma and $O_2+CF_4$ plasma.

8. The method as claimed in claim 1, wherein said step of removing further comprises a step of removing a polymer that is formed on the exposed wafer using a diluted solution containing HF.

9. The method as claimed in claim 1, further comprising a step of removing a polymer that is formed on the exposed wafer using a diluted solution containing HF before said step of removing.

10. A method of removing a polymer of a semiconductor device, said method comprising the steps of:
    forming a photoresist pattern on a layer which includes a to-be-etched portion;
    etching said to-be-etched portion with a portion of said photoresist pattern which is formed directly above the to-be-etched portion thereby exposing a wafer using said photoresist pattern;
    removing remainder of said photoresist pattern and a polymer that is generated during the etching step by dry etching at a temperature range between 100° C. and 200° C. in a dry etching chamber; and
    second removing the remainder of said photoresist pattern and the polymer at a higher temperature of above 200° C. in said dry etching chamber.

11. The method as claimed in claim 10, further comprising a step of treating said layer using a mixed solution of sulfuric acid and oxygenated water in order to remove an organic substance that is left on the wafer exposed by said etching step.

12. The method as claimed in claim 10, wherein said layer is selected from the group consisting of an oxide layer, a nitride layer and a metal layer.

13. The method as claimed in claim 12, wherein said oxide layer is dry-etched by introducing a gas containing carbon and flourine into a reaction chamber, and then generating plasma in said reaction chamber.

14. The method as claimed in claim 10, wherein said carbon/fluorine compound gas is selected from the group consisting of $CF_4$, $C_2F_6$, $C_3F_8$, $C_4F_8$, $CHF_3$ and $CH_3F$.

15. The method as claimed in claim 10, wherein the step of removing is carried out under a process condition of said chamber, said process condition being power of 500 to 1500 W, RF power of 0 to 1000 W, pressure of 0.5 to 10 mTorr, flow rate of $C_4F_8$ of 5 to 50 sccm and flow rate of $_2O$ of below 50 sccm.

16. The method as claimed in claim 10, wherein said photoresist pattern and polymer are removed using at least one of the group consisting of $O_2$ plasma, $O_2+N_2$ plasma, $O_2+N_2+CF_4$ plasma and $O_2+CF_4$ plasma.

17. The method as claimed in claim 10, wherein said step of second removing further comprises a step of removing a polymer that is formed on exposed wafer using a diluted solution containing HF.

18. The method as claimed in claim 10, further comprising a step of removing a polymer that is formed on the exposed wafer using a diluted solution containing HF before said step of removing.

* * * * *